(12) United States Patent
Inaoka

(10) Patent No.: US 7,629,530 B2
(45) Date of Patent: Dec. 8, 2009

(54) ENERGY RECOVERY SYSTEM

(75) Inventor: Hiroya Inaoka, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 658 days.

(21) Appl. No.: 10/525,508

(22) PCT Filed: Mar. 29, 2004

(86) PCT No.: PCT/JP2004/004400

§ 371 (c)(1),
(2), (4) Date: Feb. 24, 2005

(87) PCT Pub. No.: WO2004/092662

PCT Pub. Date: Oct. 28, 2004

(65) Prior Publication Data

US 2005/0247336 A1  Nov. 10, 2005

(30) Foreign Application Priority Data

Apr. 17, 2003  (JP) .............................. 2003-112980

(51) Int. Cl.
*H01L 35/30* (2006.01)
(52) U.S. Cl. ........................... 136/205; 60/272; 60/278; 60/320; 60/324; 62/3.2; 62/3.3; 62/3.61; 62/238.3; 165/41; 165/42; 165/43
(58) Field of Classification Search ................ 136/205, 136/200, 211, 212, 218; 60/320, 272, 278, 60/321, 324; 62/3.2, 3.3, 3.61, 238.3, 239
See application file for complete search history.

(56) References Cited

U.S. PATENT DOCUMENTS

| | | | |
|---|---|---|---|
| 3,817,043 A | 6/1974 | Zoleta | |
| 4,753,682 A * | 6/1988 | Cantoni | 136/212 |
| 4,949,553 A * | 8/1990 | Suzuki | 62/238.7 |
| 5,845,507 A * | 12/1998 | Critoph et al. | 62/106 |
| 5,974,803 A | 11/1999 | Hammerschmidt | |
| 6,272,873 B1 | 8/2001 | Bass | |

(Continued)

FOREIGN PATENT DOCUMENTS

EP  1 331 113  7/2003

(Continued)

OTHER PUBLICATIONS

Miyamoto et al, "Heat using system", Feb. 10, 2003, machne translation of JP2003-278539.*

(Continued)

*Primary Examiner*—Jennifer K Michener
*Assistant Examiner*—Xiuyu Tai
(74) *Attorney, Agent, or Firm*—Kenyon & Kenyon LLP

(57) ABSTRACT

An energy recovery system for hybrid automobile. The energy recovery system generates electricity by utilizing the temperature difference between a high temperature thermal medium and a low temperature thermal medium. As the high temperature thermal medium, engine coolant for cooling an engine is used. As the low temperature thermal medium, pump refrigerant for cooling by a heat pump is used. The heat pump maintains the pump refrigerant at a low temperature by using heat from the engine coolant. Therefore, while electricity is reliably generated at a thermoelectric converter, energy is efficiently used for cooling the pump refrigerant.

14 Claims, 2 Drawing Sheets

U.S. PATENT DOCUMENTS

| | | | |
|---|---|---|---|
| 6,562,754 | B1 | 5/2003 | Inagaki et al. |
| 2004/0045594 | A1 | 3/2004 | Hightower |

FOREIGN PATENT DOCUMENTS

| | | |
|---|---|---|
| JP | 02-303381 | 12/1990 |
| JP | 09-32636 | 2/1997 |
| JP | 10-238406 | 9/1998 |
| JP | 2000-262892 A | 9/2000 |
| JP | 2001-023666 | 1/2001 |
| JP | 2001-041604 A | 2/2001 |
| JP | 2002-059736 | 2/2002 |
| JP | 2003-278539 * | 2/2009 |
| WO | WO 98/34807 | 8/1998 |

OTHER PUBLICATIONS

Applied Thermal Engineering, vol. 16, No. 5, pp. 389-394, 1996.

* cited by examiner

ENERGY RECOVERY SYSTEM

FIELD OF THE INVENTION

The present invention relates to an energy recovery system.

BACKGROUND OF THE INVENTION

Energy recovery systems have been proposed for recovering surplus energy produced during operation of various kinds of working devices to improve the energy efficiency of the working devices. Such an energy recovery system converts heat generated during operation of the working devices into electrical energy. A typical energy recovery system has a thermoelectric converter that generates electricity by utilizing a temperature difference between a high temperature thermal medium (high temperature medium) and a low temperature thermal medium (low temperature medium). As a high temperature medium, a thermal medium that receives heat during operation of the working devices is used, and as a low temperature medium, a thermal medium the temperature of which is lower than the high temperature medium is used. The thermoelectric converter uses waste heat from the working devices to generate electricity. In other words, heat is converted into electrical energy.

Such energy recovery systems include types that are applied to vehicles such as automobiles. For example, Japanese Laid-Open Patent Publication No. 2001-23666 discloses an energy recovery system for an automobile. When the power source and other working devices of a vehicle are operating, heat from the power source and other working devices escapes as waste heat. The system disclosed in the publication uses the waste heat to generate electricity in a thermoelectric converter, which electricity is used for charging the vehicle battery. In this way, the waste heat from the power source and other working devices is recovered as electrical energy. In the energy recovery system disclosed in the publication, the thermoelectric converter uses the coolant for cooling the power source and other working devices as a high temperature medium, and uses the outside air, the temperature of which is lower than that of the coolant, as a low temperature medium.

However, in a vehicle using an energy recovery system according to the above publication, normal operation of the power source and other working devices cannot increase the temperature of the power source and other working devices (the temperature of the coolant) above a certain level. Therefore, the temperature difference between the coolant and the outside air can be insufficient for generating electricity with the thermoelectric converter. Therefore, in Japanese Laid-Open Patent Publication No. 2001-23666, operation of the power source and other working devices is controlled to increase the coolant temperature so that the temperature difference between the coolant and the outside air is sufficient for generating electricity. However, the control for increasing the temperature of the power source and other working devices can adversely affect the power source and other working devices.

To avoid such drawbacks, Japanese Laid-Open Patent Publication No. 2002-59736 discloses a technique applied to a case where an internal combustion engine is used as a drive source. To generate electricity with a thermoelectric converter, the technique uses the temperature difference between exhaust of the engine and the coolant temperature, instead of the temperature difference between the coolant and the outside air. In this case, the low temperature medium is the coolant and the high temperature medium is the exhaust. Since the temperature of the exhaust is significantly higher than the coolant temperature, normal operation of the engine guarantees a sufficient temperature difference for generating electricity through thermoelectric conversion. However, although the temperature of the coolant is relatively stable, the temperature of the exhaust greatly varies depending on the operating state of the engine, for example, in a range from 100° C. to 800° C. Such great temperature changes can damage the thermoelectric converter.

Thus, to reliably generate electricity with a thermoelectric converter that utilizes a temperature difference, it is important that the temperature difference be sufficiently great and that the temperatures of the used thermal media be stable. Therefore, it has been proposed that the high temperature medium be coolant from the power source and other working devices and that the low temperature medium be a low temperature refrigerant since the temperature of coolant is relatively stable, and the temperature of a refrigerant is forcibly maintained low by a refrigeration apparatus. In this case, although coolant from the power source and other working devices is used as the high temperature medium, the temperature difference between the high temperature medium and the low temperature medium is sufficient for generating electricity since the low temperature refrigerant, which is the low temperature medium, is maintained to be cold by the refrigeration apparatus. Further, since the temperature of the low temperature refrigerant is maintained in a certain range by the refrigeration apparatus, the temperature of the refrigerant is not abruptly changed, which prevents the thermoelectric converter from being damaged.

Therefore, using low temperature refrigerant as the low temperature medium, the temperature of which is maintained to be low by a refrigeration apparatus, permits the temperature difference between the high temperature medium and the low temperature medium to be sufficient for generating electricity, and prevents the thermoelectric converter from being damaged. Accordingly, the thermoelectric converter is capable of reliably generating electricity.

However, if a great amount of energy is consumed to drive the refrigeration apparatus so that the low temperature refrigerant is maintained to be cold, a possible improvement of the energy efficiency, which would be brought about by the energy recovery system, is hindered. Such problems occur not only in a case where the energy recovery system is used in a vehicle such as an automobile, but also in a case where the energy recovery system is applied to various apparatuses other than vehicles.

SUMMARY OF THE INVENTION

Accordingly, it is an objective of the present invention to provide an energy recovery system that improves energy efficiency, while reliably generating electricity with a thermoelectric converter.

To achieve the above objective, the present invention provides an energy recovery system for converting heat generated during operation of a working device into electrical energy using first and second thermal media and recovering the electrical energy. The system includes a cooling device that cools one of the thermal media, generating a low temperature thermal medium by maintaining the temperature of the one of the thermal media at a predetermined value, and a thermoelectric converter that generates electricity by utilizing a temperature difference between the low temperature thermal medium and the other one of the thermal media. The other one of the thermal media is maintained at a temperature higher than the low temperature thermal medium by heat generated during operation of the working device to generate a high temperature thermal medium with the other one of the thermal media. The cooling device is a heat pump that generates the low temperature thermal medium by utilizing heat from the high temperature thermal medium.

DETAILED DESCRIPTION OF THE PREFERRED EMBODIMENTS

An energy recovery system according to one embodiment of the present invention will now be described with reference to FIGS. 1 to 3. The energy recovery system is used in a hybrid automobile.

Figure 1:
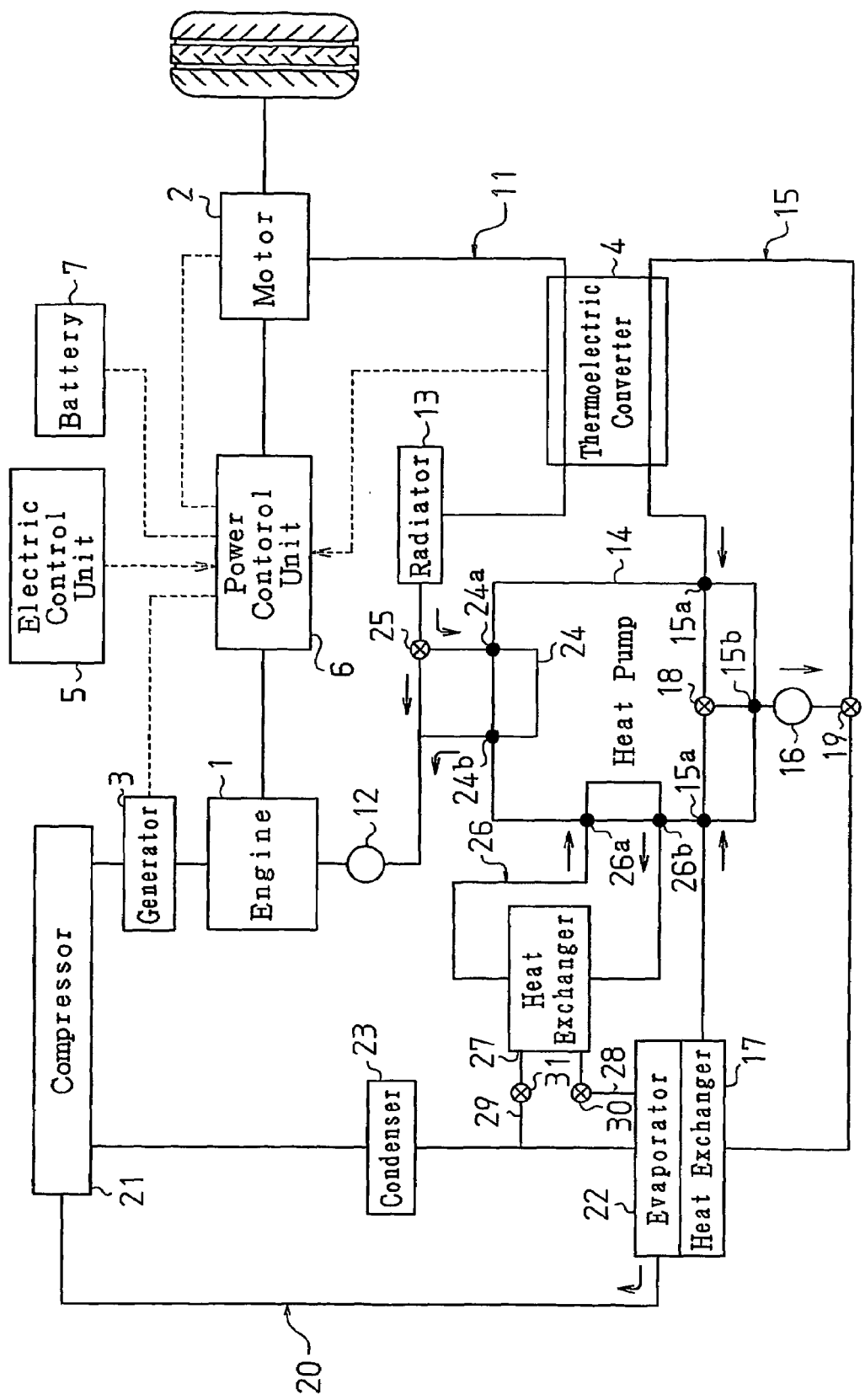
FIG. 1 is a diagrammatic view illustrating an energy recovery system according to one embodiment.

As shown in FIG. 1, the hybrid automobile has an engine 1 and a motor 2 as drive sources. The automobile also has a generator 3 and a thermoelectric converter 4 for charging a battery 7. The generator 3 is driven by the engine 1 to generate electricity. The thermoelectric converter 4 uses waste heat from the vehicle to generate electricity. Charging of the battery 7 with electricity generated by the thermoelectric converter 4 allows waste heat from the automobile to be recovered as electrical energy. The output of the generator 3 and the thermoelectric converter 4 and the operation of the motor 2 are controlled by a power control unit 6, which is controlled by an electric control unit 5.

The hybrid automobile further has an engine coolant circuit 11, in which engine coolant (high temperature refrigerant) circulates to cool the engine 1, the motor 2, and the power control unit 6. The engine coolant in the engine coolant circuit 11 is circulated through the circuit 11 by a coolant pump 12. The engine coolant passes through a radiator 13 after passing through the thermoelectric converter 4. When the engine coolant circulates in the engine coolant circuit 11, heat exchange takes place between the engine coolant and working devices that include the engine 1, the motor 2, and the power control unit 6. The temperature of the engine coolant is maintained in a range between 80° C. and 90° C. by heat generated during operation of the working devices.

The thermoelectric converter 4 generates electricity utilizing a difference between the temperature of a high temperature thermal medium (high temperature medium) and the temperature of a low temperature thermal medium (low temperature medium). The engine coolant, which passes through the thermoelectric converter 4, is used as the high temperature medium. As the low temperature medium, pump refrigerant (low temperature refrigerant) circulating in a pump refrigerant circuit 15 is used. The pump refrigerant in the pump refrigerant circuit 15 is circulated through the circuit 15 by a refrigerant pump 16 and passes through the thermoelectric converter 4. The pump refrigerant is cooled by a heat pump 14 and maintained at a low temperature in a range, for example, between 10° C. and 20° C.

The engine coolant, which is the high temperature medium used in electricity generation at the thermoelectric converter 4, is maintained at a high temperature, and the pump refrigerant, which is the low temperature medium used in the electricity generation, is maintained at a low temperature by the heat pump 14. The temperatures of the high temperature medium and the low temperature medium both fluctuate in a narrow range and are stable. Thus, the thermoelectric converter 4 is hardly damaged by a great temperature change in the high temperature medium or the low temperature medium. The pump refrigerant is cooled by the heat pump 14 so that the temperature of the pump refrigerant is maintained to be low. Accordingly, the temperature difference between the engine coolant and the pump refrigerant is sufficient for electricity generation at the thermoelectric converter 4.

The pump refrigerant in the pump refrigerant circuit 15 is not only used for electricity generation at the thermoelectric converter 4, but also used to assist air conditioning performed by an air conditioner mounted on the hybrid automobile. Specifically, the pump refrigerant circuit 15 has a first heat exchanger 17, which performs heat exchange between the low temperature refrigerant passing through the first heat exchanger 17 and air that will be drawn into the passenger compartment. The pump refrigerant circuit 15 also includes valves 18, 19 for selecting a course for the pump refrigerant, which is circulated by the refrigerant pump 16, between a course including the thermoelectric converter 4 and a course including the first heat exchanger 17. In other words, the valves 18, 19 are switched such that the pump refrigerant is selectively guided to one of the thermoelectric converter 4 and the first heat exchanger 17. For example, when the cooling load is great during operation of the air conditioner, the valves 18, 19 are switched to guide the pump refrigerant to the first heat exchanger 17. In other conditions, the valves 18, 19 are switched to guide the pump refrigerant to the thermoelectric converter 4. The valves 18, 19 function as a switching device to switch the course through which the pump refrigerant flows.

A refrigeration circuit for the air conditioner, or an air conditioner refrigerant circuit 20, includes a compressor 21. As the compressor 21 operates, the air conditioner refrigerant circulates in the circuit 20 and passes through a condenser 23 and an evaporator 22 provided in the circuit 20. High temperature and high pressure air conditioner refrigerant that has been discharged from the compressor 21 is liquefied by the condenser 23. The liquefied refrigerant is then sent to the evaporator 22 via an expansion valve (not shown). The evaporator 22 performs heat exchange between refrigerant passing through the evaporator 22 and air that will be supplied to the passenger compartment. As a result, the refrigerant evaporates, and the latent heat required for the evaporation cools the air, which is, in turn, supplied to the passenger compartment. The first heat exchanger 17 is located in the vicinity of the evaporator 22. Air that has been cooled by the evaporator 22 is further cooled by the pump refrigerant that passes through the first heat exchanger 17.

The heat pump, which cools the pump refrigerant, will now be described.

As the heat pump 14, an adsorption heat pump is used, in which adsorption and desorption of a working medium such as ammonia to and from an adsorbent such as activated carbon are repeatedly performed. In the heat pump 14, the working medium that has been desorbed from the adsorbent and evaporated is temporarily liquefied, and then evaporated. At this time, latent heat of evaporation is used to lower the temperature of the pump refrigerant, thereby cooling the pump refrigerant.

During desorption in the heat pump 14, in which the working medium is desorbed from the adsorbent, the heat of the engine coolant circulating in the engine coolant circuit 11 is used to heat the adsorbent to perform the desorption. In a section downstream of the radiator 13 in the engine coolant circuit 11, a bypass passage 24 is provided to draw the engine coolant into the heat pump 14. A valve 25 is located in a section downstream of the radiator 13. The valve 25 is opened and closed to permit and inhibit the flow of the engine coolant into the bypass passage 24. After passing through the bypass passage 24, the engine coolant enters the heat pump 14 through a port 24a and exits the heat pump 14 through a port 24b. In the heat pump 14, the adsorbent is heated by the heat from the engine coolant, which desorbs the working medium from the adsorbent.

After being desorbed, the working medium is in an evaporated state. A heat pump coolant circuit 26 is provided as a cooling system for liquefying the evaporated working medium. A second heat exchanger 27 is provided in the heat pump coolant circuit 26. The second heat exchanger 27 is connected to the air conditioner refrigerant circuit 20 through passages 28, 29. Low temperature air conditioner refrigerant is drawn into the second heat exchanger 27 of the air conditioner refrigerant circuit 20 as a valve 30 provided in the passage 28 is opened and closed. Also, as a valve 31 provided in the passage 29 is opened, high temperature air conditioner refrigerant is drawn into the second heat exchanger 27 from a section of the air conditioner refrigerant circuit 20 that is downstream of the condenser 23. As the valves 30, 31 are opened and closed, the amount of the high temperature air conditioner refrigerant and the amount of low temperature air conditioner refrigerant drawn into the second heat exchanger 27 are adjusted. Accordingly, the temperature of the air conditioner refrigerant in the second heat exchanger 27 is adjusted. When heat pump coolant in the heat pump coolant circuit 26 passes through the second heat exchanger 27, heat exchange takes place between the heat pump coolant and the air conditioner refrigerant, which cools the heat pump coolant so that its temperature is maintained in a range, for example, between 30° C. and 50° C. That is, to maintain the temperature of the heat pump coolant in the range, the amount of high temperature air conditioner refrigerant and the amount of low temperature air conditioner refrigerant drawn into the first heat exchanger 17 are adjusted.

The heat pump coolant circulating in the heat pump coolant circuit 26 enters the heat pump 14 through a port 26a and exits the heat pump 14 through a port 26b. In the heat pump 14, the working medium that has been desorbed and is in an evaporated state is cooled by the heat pump coolant. This liquefies the working medium. On the other hand, the pump refrigerant circulating in the pump refrigerant circuit 15 enters the heat pump 14 through a port 15a and exits the heat pump 14 through a port 15b. In the heat pump 14, the pump refrigerant in the pump refrigerant circuit 15 is cooled by latent heat of evaporation produced when the working medium is evaporated after being liquefied as described above. This maintains the pump refrigerant in a low temperature range, for example, between 10° C. and 20° C. The pump refrigerant, which is cooled and maintained at a low temperature, is used in electricity generation at the thermoelectric converter 4 and in cooling of the air conditioner refrigerant.

The working medium that evaporates when the pump refrigerant is cooled will be adsorbed by the adsorbent. When the working medium is adsorbed by the adsorbent, the adsorbent generates heat. At this time, the generated heat is transmitted to the heat pump coolant, which circulates in the heat pump coolant circuit 26 and is drawn into the heat pump 14. Therefore, even if the adsorbent generates heat during adsorption of the working medium, the generated heat is taken away by the heat pump coolant. This prevents the temperature of the adsorbent from being abruptly increased.

The internal structure of the heat pump 14, and desorption and adsorption of the heat pump 14 will now be described with reference to FIGS. 2 and 3.

Figure 2:
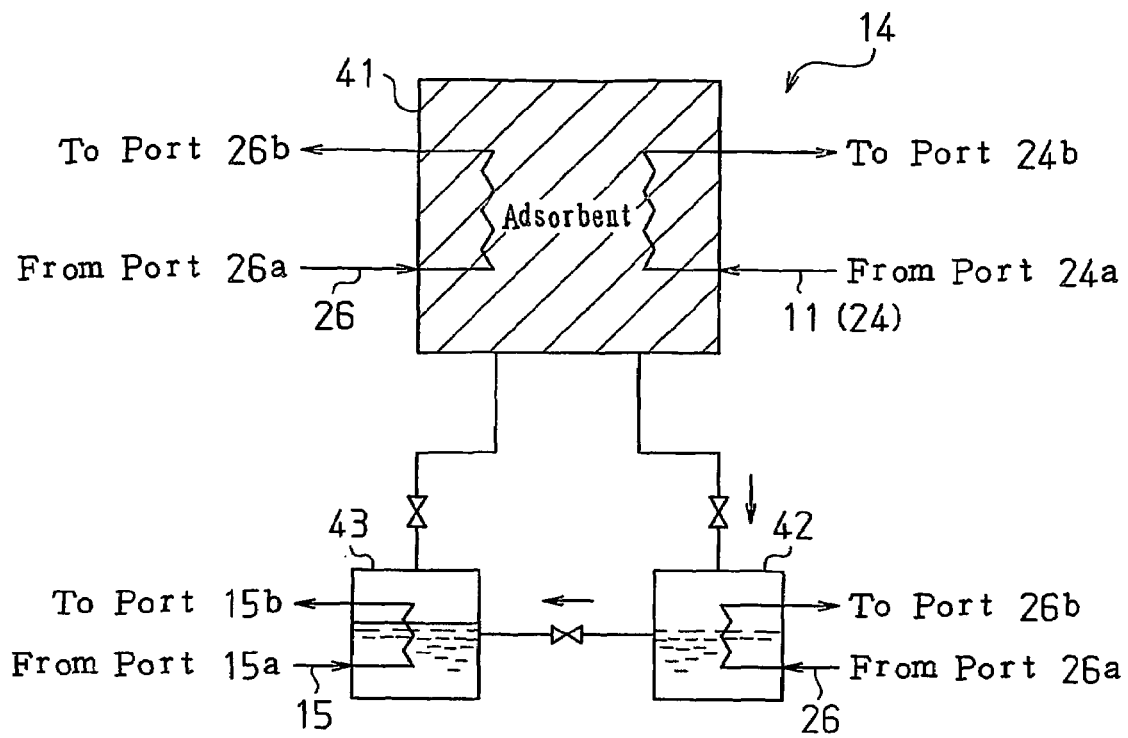
FIG. 2 is a diagrammatic view illustrating desorption by the heat pump shown in FIG. 1.
Figure 3:
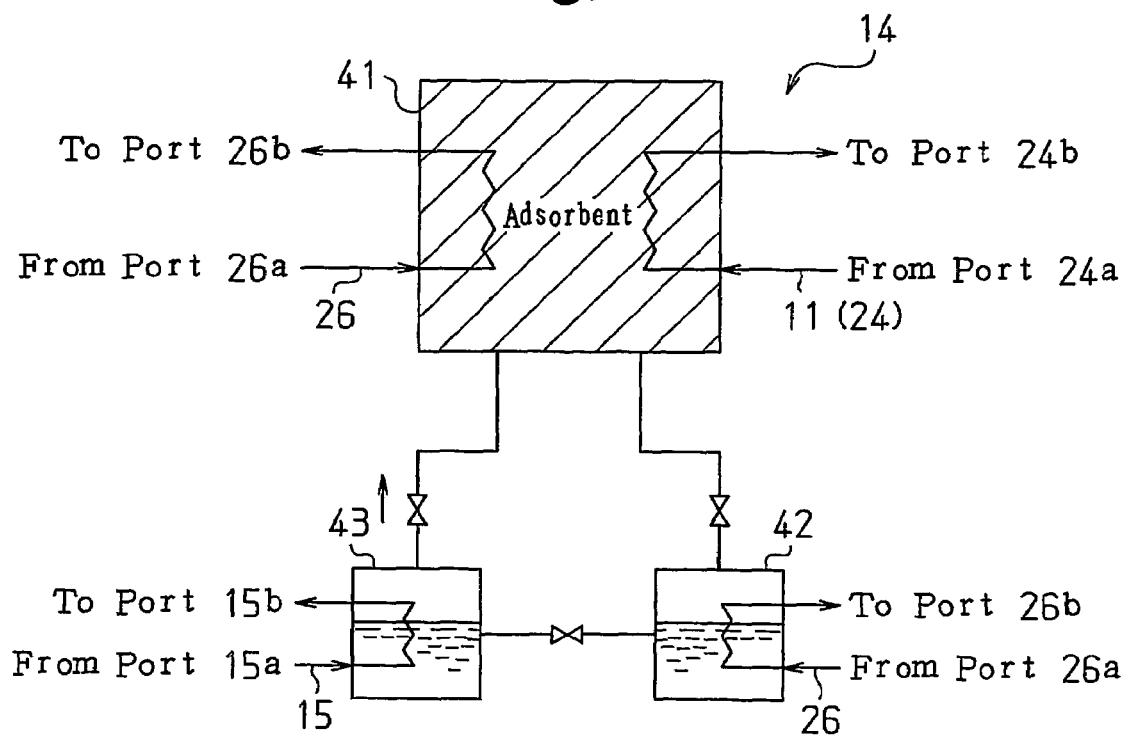
FIG. 3 is a diagrammatic view illustrating adsorption by the heat pump shown in FIG. 1.

As shown in FIG. 2, the heat pump 14 includes an adsorber/desorber 41 containing adsorbent, a condenser 42 for liquefying a working medium from an evaporated state after being desorbed from the adsorbent, and an evaporator 43 for evaporating the working medium that has been liquefied by the condenser 42. The engine coolant circuit 11 (specifically, the bypass passage 24) passes through the adsorber/desorber 41, and the heat pump coolant circuit 26 passes through the adsorber/desorber 41 and the condenser 42. The pump refrigerant circuit 15 passes through the evaporator 43.

In the desorption, the engine coolant that has entered the heat pump 14 through the port 24a flows through a section of the engine coolant circuit 11 that corresponds to the adsorber/desorber 41. At this time, heat exchange takes place between the engine coolant and the adsorbent. Accordingly, the adsorbent is heated so that the working medium is desorbed from the adsorbent. In this manner, the desorption of the working medium from the adsorbent is performed by using the heat from the engine coolant, the temperature of which is maintained to be high, for example, in a range between 80° C. and 90° C. by waste heat from the hybrid automobile.

When after being desorbed from the adsorbent, the working medium flows into the condenser 42 in an evaporated state. In the condenser 42, the heat pump coolant that has entered the heat pump 14 through the port 26a flows through a section of the heat pump coolant circuit 26 that corresponds to the condenser 42. At this time, heat exchange takes place between the heat pump coolant and the working medium. Accordingly, the working medium is cooled and thus liquefied. The liquefaction of the working medium in an evaporated state is performed by using the heat pump coolant, the temperature of which is maintained, for example, in a range between 30° C. and 50° C., by the air conditioner refrigerant.

The working medium that has been liquefied by the condenser 42 flows into the evaporator 43. In the evaporator 43, the pump refrigerant that has entered the heat pump 14 through the port 15a flows through a section of the pump refrigerant circuit 15 that corresponds to the evaporator 43. Also, in the evaporator 43, the liquefied working medium evaporates, and the latent heat of evaporation lowers the temperature of the pump refrigerant. As the pump refrigerant is cooled in this manner, the temperature of the pump refrigerant is maintained to be low, for example, in a range between 10° C. and 20° C. The pump refrigerant, the temperature of which is maintained to be low, flows to the thermoelectric converter 4 or the first heat exchanger 17 shown in FIG. 1 through the pump refrigerant circuit 15, and is used for electricity generation at the thermoelectric converter 4 or for assisting air conditioning of the air conditioner.

In the adsorption, the working medium that has evaporated at the evaporator 43 flows into the adsorber/desorber 41 and is adsorbed by the adsorbent. At this time, the adsorbent generates heat. However, since the heat pump coolant that has entered the heat pump 14 through the port 26a flows through a section of the heat pump coolant circuit 26 that corresponds to the adsorber/desorber 41 to take away the heat of the adsorbent, the temperature of the adsorbent is prevented from being excessively increased.

The above described embodiment has the following advantages.

(1) To reliably generate electricity with the thermoelectric converter 4 by utilizing waste heat from the hybrid automobile, it is important to maintain the temperature of the pump refrigerant in a predetermined low temperature range so that the temperature difference between the high temperature engine coolant and the low temperature pump refrigerant is suitable for generating electricity. The heat pump 14, which functions as a cooling device, maintains the temperature of the pump refrigerant at a low temperature only by using heat from the engine coolant, the temperature of which is maintained to be high by waste heat from the automobile. Therefore, the energy is efficiently used for cooling the pump refrigerant. Thus, the above described embodiment permits the thermoelectric converter 4 to reliably generate electricity, while maintaining the pump refrigerant at a low temperature. At the same time, the embodiment improves the energy efficiency of the hybrid automobile.

(2) Since electricity generation is reliably performed by the thermoelectric converter 4, the size of the generator 3 for charging the battery 7 of the hybrid automobile can be reduced.

(3) The heat pump 14 is an adsorption heat pump, which requires a small amount of energy to operate. Therefore, compared to a case where a heat pump of another type is used for cooling the pump refrigerant, the amount of energy required for cooling the pump refrigerant is small.

(4) When the working medium evaporates after being desorbed and liquefied, the latent heat of evaporation causes the temperature of the working medium to drop. This causes heat exchange between the working medium and the pump refrigerant to take place. The heat pump 14 cools the pump refrigerant by utilizing this heat exchange. Immediately after desorption, the working medium flows to the condenser 42 in an evaporated state. Then, heat exchange takes place between the working medium in an evaporated state and the heat pump coolant maintained in a temperature range, for example, between 30° C. and 50° C. This cools and effectively liquefies the working medium. Then, the latent heat of evaporation of the liquefied working medium cools the pump refrigerant. Therefore, the heat pump 14 effectively cools the pump refrigerant.

(5) The pump refrigerant cooled by the heat pump 14 is not only used for generating electricity at the thermoelectric converter 4, but also for assisting air conditioning of the air conditioner of the hybrid automobile. Therefore, the illustrated embodiment not only improves the energy efficiency by recovering waste heat from the automobile as electrical energy, but also assists the air conditioning of the passenger compartment using waste heat. Thus, the energy efficiency is further improved. Also, since the air conditioning of the passenger compartment is assisted, the sizes of the compressor 23 and the condenser 23 can be reduced while improving the cooling performance of the air conditioner.

(6) The pump refrigerant cooled by the heat pump 14 is guided to the first heat exchanger 17 when air conditioning needs to be assisted during operation of the air conditioner. In other cases, the pump refrigerant is guided to the thermoelectric converter 4 and is used in electricity generation at the thermoelectric converter 4. In this manner, when the pump refrigerant is not used for assisting air conditioning, the pump refrigerant is always used for electricity generation at the thermoelectric converter 4. Therefore, cooling of the pump refrigerant by the heat pump 14 is not performed for no purpose. In other words, energy efficiency is further improved.

(7) In the hybrid automobile, the power source such as the engine 1 and the motor 2 are high temperature portions, and the heat from these portions maintains the engine coolant at a high temperature. Therefore, the temperature difference between the engine coolant and the pump refrigerant is easily increased, and the output from the thermoelectric converter 4 based on the temperature difference is great. Thus, energy recovery based on charging of the battery 7 by the electricity generation is efficiently performed.

The above described embodiments may be modified as follows.

In the illustrated embodiment, the engine coolant in the engine coolant circuit 11, which cools the engine 1, the motor 2, and the power control unit 6, is used in the electricity generation at the thermoelectric converter 4. However, the present invention may be different from this configuration. For example, in a case where the engine 1, the motor 2, and the power control unit 6 are not cooled by a single system (the engine coolant circuit 11), but by two or more systems, the coolant of any one of the systems may be used in the electricity generation at the thermoelectric converter 4.

In the illustrated embodiment, the pump refrigerant is selectively guided to the thermoelectric converter 4 and the first heat exchanger 17. However, the pump refrigerant may be guided to both of the thermoelectric converter 4 and the first heat exchanger 17. Further, a configuration may be adopted in which the pump refrigerant is guided to both of the thermoelectric converter 4 and the first heat exchanger 17 only when the air conditioning demands assistance, and the pump refrigerant is guided only to the thermoelectric converter 4 when there is no such demand.

The pump refrigerant may be used only for the electricity generation at the thermoelectric converter 4.

In the illustrated embodiment, the energy recovery system according to the present invention is applied to a hybrid automobile. However, the energy recovery system may be applied to an automobile that has only one of the engine 1 and the motor 2 as the drive source. Alternatively, the energy recovery system may be applied to a vehicle other than an automobile or to any types of apparatuses other than vehicles. When applied to an apparatus other than a vehicle, the heat pump 14 is not necessarily an adsorption heat pump, but may be other types of heat pump such as a mechanical heat pump or an adsorption type chemical heat pump.

The invention claimed is:

1. An energy recovery system for converting heat generated during operation of a working device into electrical energy using first and second thermal media and recovering the electrical energy, the system comprising:
   a cooling device that cools the first thermal media, generating a low temperature thermal medium by maintaining the temperature of the first thermal media at a predetermined value; and
   a thermoelectric converter that generates electricity by utilizing a temperature difference between the low temperature thermal medium and the second thermal media, with the second thermal media being maintained at a temperature higher than the low temperature thermal medium by heat generated during operation of the working device to generate a high temperature thermal medium with the second thermal media,
   wherein the cooling device is a heat pump that generates the low temperature thermal medium by utilizing heat from the high temperature thermal medium,
   wherein the working device is a drive source mounted on a vehicle for causing the vehicle to travel, and the high temperature thermal medium is high temperature coolant that has been used to cool the drive source.

2. The energy recovery system according to claim 1, wherein the heat pump is an adsorption heat pump having a working medium and an adsorbent that is capable of adsorbing and desorbing the working medium, the adsorbent heat pump has a function to desorb the working medium from the adsorbent by using heat from the high temperature thermal medium, a function to liquefy the working medium that has evaporated during the desorption, and a function to evaporate the liquefied working medium by using heat from the first thermal media that is used to generate the low temperature thermal medium.

3. The energy recovery system according to claim 2, further comprising a cooling system for cooling and liquefying the working medium that has evaporated during the desorption from the adsorbent.

4. The energy recovery system according to claim 3, wherein the heat pump further has a function to cause the adsorbent to adsorb the working medium that has been evaporated by heat from the first thermal media, and wherein the cooling system limits the generation of heat at the adsorbent caused by the adsorption of the working medium.

5. The energy recovery system according to claim 3, wherein the energy recovery system is for use with a refrigerant and an air conditioner having a refrigerant circuit for circulation of the refrigerant, and the cooling system supplies to the heat pump, coolant that has been cooled by the refrigerant circulating in the refrigerant circuit.

6. The energy recovery system according to claim 1, wherein the energy recovery system is for use with an air conditioner mounted on the vehicle and includes a heat exchanger through which the low temperature thermal medium generated by the heat pump passes, wherein, when the air conditioner cools air that will be sent to a passenger compartment of the vehicle, the heat exchanger performs heat exchange between the low temperature thermal medium passing through the heat exchanger and the air that will be sent to the passenger compartment to assist cooling operation of the air conditioner.

7. The energy recovery system according to claim 6, further comprising a switching device that switches a course of travel of the low temperature thermal medium, such that the low temperature thermal medium is selectively used for electricity generation at the thermoelectric converter or for assisting the cooling operation of the air conditioner by operation of the switching device.

8. The energy recovery system according to claim 5, wherein the air conditioner is mounted on the vehicle.

9. The energy recovery system according to claim 1, wherein the vehicle has a battery, and electricity generated at the thermoelectric converter is used for charging the battery.

10. The energy recovery system according to claim 1, wherein the first and second thermal media are different.

11. The energy recovery system according to claim 1, wherein the vehicle is a hybrid vehicle.

12. The energy recovery system according to claim 2, wherein the working medium is ammonia and the adsorbent is activated carbon.

13. The energy recovery system according to claim 1, wherein the low temperature thermal medium is maintained in a range of 10-20° C.

14. The energy recovery system according to claim 1, wherein the high temperature thermal medium is maintained in a range of 80-90° C.

* * * * *

UNITED STATES PATENT AND TRADEMARK OFFICE
CERTIFICATE OF CORRECTION

PATENT NO.        : 7,629,530 B2                                              Page 1 of 1
APPLICATION NO. : 10/525508
DATED             : December 8, 2009
INVENTOR(S)       : Hiroya Inaoka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 928 days.

Signed and Sealed this

Second Day of November, 2010

David J. Kappos
*Director of the United States Patent and Trademark Office*